(12) United States Patent
Chen et al.

(10) Patent No.: US 9,515,570 B2
(45) Date of Patent: Dec. 6, 2016

(54) VOLTAGE DETECTION CIRCUIT AND A METHOD OF DETECTING VOLTAGE CHANGES

(71) Applicant: Alpha and Omega Semiconductor (Cayman) Ltd., Sunnyvale, CA (US)

(72) Inventors: Yu-Ming Chen, Hsinchu (TW); Chih-Yuan Liu, Zhubei (TW); Pei-Lun Huang, Zhubei (TW)

(73) Assignee: Alpha and Omega Semiconductor, Inc., Sunnyvale, CA (US)

( * ) Notice: Subject to any disclaimer, the term of this patent is extended or adjusted under 35 U.S.C. 154(b) by 67 days.

(21) Appl. No.: 14/671,001

(22) Filed: Mar. 27, 2015

(65) Prior Publication Data

US 2016/0164430 A1  Jun. 9, 2016

(30) Foreign Application Priority Data

Dec. 3, 2014 (CN) .......................... 2014 1 0728046

(51) Int. Cl.
*H02M 7/217* (2006.01)
*G01R 19/22* (2006.01)
(Continued)

(52) U.S. Cl.
CPC ............ *H02M 7/217* (2013.01); *G01R 19/145* (2013.01); *G01R 19/15* (2013.01); *G01R 19/155* (2013.01);
(Continued)

(58) Field of Classification Search
CPC ..... G01R 19/155; G01R 19/145; G01R 19/15; G01R 19/0007; G01R 19/22; H02M 7/217; H02M 7/04; H02M 1/32; H02M 1/4225; Y02B 70/126

See application file for complete search history.

(56) References Cited

U.S. PATENT DOCUMENTS

| | | |
|---|---|---|
| 6,862,194 B2 | 3/2005 | Yang et al. |
| 6,940,320 B2 | 9/2005 | Sukup et al. |

(Continued)

FOREIGN PATENT DOCUMENTS

| | | |
|---|---|---|
| CN | 201450456 U | 5/2010 |
| CN | 103986336 A | 8/2014 |

(Continued)

*Primary Examiner* — Jessica Han
*Assistant Examiner* — Demetries A Gibson
(74) *Attorney, Agent, or Firm* — Chein-Hwa Tsao; Lance A. Li; 5Suns (57) ABSTRACT

A power conversion system and a method for voltage change detection, specifically, relates to a detection circuit implemented in the AC-DC power converter, detect the voltage change. The AC input voltage is rectified to convert into a DC input voltage transmitted to a detection unit generating a detection voltage signal at different logical states corresponding to the input voltage changes. A charge current source unit is used for charging the capacitor when the detection voltage signal is in a second state and a discharge current source unit is used for discharging the capacitor when the detection voltage signal is in a first state. A primary comparator compares the voltage changes of the capacitor in the alternating charge and discharge processes with a critical zero potential and outputs a detection signal identifying the changing trend of the input voltage.

21 Claims, 6 Drawing Sheets

(51) Int. Cl.
  *G01R 19/15* (2006.01)
  *H02M 1/42* (2007.01)
  *H02M 1/32* (2007.01)
  *H02M 7/04* (2006.01)
  *G01R 19/155* (2006.01)
  *G01R 19/145* (2006.01)

(52) U.S. Cl.
  CPC ............ *H02M 1/32* (2013.01); *H02M 1/4225* (2013.01); *H02M 7/04* (2013.01)

(56) References Cited

U.S. PATENT DOCUMENTS

| | | |
|---|---|---|
| 7,265,999 B2 | 9/2007 | Murata et al. |
| 8,213,192 B2 | 7/2012 | Konecny et al. |
| 8,508,960 B2 | 8/2013 | Chen et al. |
| 2004/0155639 A1 | 8/2004 | Mobers |
| 2008/0200135 A1* | 8/2008 | Chung ............... H03D 7/1441 455/130 |
| 2009/0040796 A1 | 2/2009 | Lalithambika et al. |
| 2009/0141523 A1 | 6/2009 | Sugawara |
| 2011/0069420 A1 | 3/2011 | Chiu et al. |
| 2011/0216559 A1 | 9/2011 | Ng et al. |
| 2011/0249476 A1* | 10/2011 | Chen .................... H02H 1/0007 363/52 |
| 2012/0274299 A1 | 11/2012 | Chang et al. |
| 2013/0033236 A1* | 2/2013 | Li ......................... H02M 7/219 320/166 |
| 2013/0057323 A1 | 3/2013 | Spini et al. |
| 2013/0223108 A1 | 8/2013 | Xu |
| 2013/0258722 A1* | 10/2013 | Wang ................. H02M 1/4258 363/21.12 |
| 2015/0023070 A1* | 1/2015 | Nate ................. H02M 3/33507 363/21.17 |

FOREIGN PATENT DOCUMENTS

| | | |
|---|---|---|
| CN | 203840204 U | 9/2014 |
| TW | I437238 B | 5/2014 |

* cited by examiner

VOLTAGE DETECTION CIRCUIT AND A METHOD OF DETECTING VOLTAGE CHANGES

PRIORITY CLAIM

This application claims the priority benefit of a Chinese patent application number 201410728046.5 filed Dec. 3, 2014 by a common inventor of this Application. The entire Disclosure made in the Chinese patent application number 201410728046.5 is hereby incorporated by reference.

FIELD OF PRESENT INVENTION

The present invention relates to power conversion system, specifically, relates to a detection circuit implemented in the AC-DC power converter to detect the voltage change of a rectified AC input voltage and a detection method thereof, in which a voltage detection circuit monitors and detects changes of the input voltage and outputs a detection signal identifying the changing trend of the input voltage.

BACKGROUND OF RELATED ART

In the conventional power conversion system, AC-DC converters are used to convert the AC input voltage $V_{AC}$ supplied by the grid power to a desired DC voltage $V_{DC}$ which is then modulated by the voltage converter generating a final DC output voltage $V_{OUT}$ with small ripples. The conventional technique employed in the AC-DC conversion system of prior art faces a problem is that the peak or effective value of the AC input voltage $V_{AC}$ is not constant at all times. When AC input voltage $V_{AC}$ supplied from the grid power is in brown-out or overvoltage condition, it may cause damage to the AC-DC converter. Thus real-time monitoring and determination of the trend of AC input voltage $V_{AC}$ is essential.

In the U.S. Patent Publication US20090141523, two resistors in series are used to form a voltage divider and a detection voltage reflecting the changes in the input voltage $V_{AC}$ is produced at a common node between them. The two resistors are connected in series between the output terminal, at which the voltage is $V_M$, and the ground. It is well known in the art that the current flowing through the two resistors, as a result, the resistors consume power, even though the two resistors merely serve as secondary detection components. In view of this, the requirement of a device that can effectively detect changes in input voltage $V_{AC}$, thus accurately reflects the changing trends of voltage $V_{AC}$, but at the same time able to avoid unnecessary excessive power consumption is a big challenge.

It is within this context that embodiments of the present invention arise.

BRIEF DESCRIPTION OF THE DRAWINGS

The embodiments of this invention are described in more detail with reference to the accompanying drawings. However, the accompanying drawings are for the purpose of descriptions and illustrations only and do not impose limitation to the scope of the present invention.

DESCRIPTION OF THE SPECIFIC EMBODIMENTS

Figure 1A:
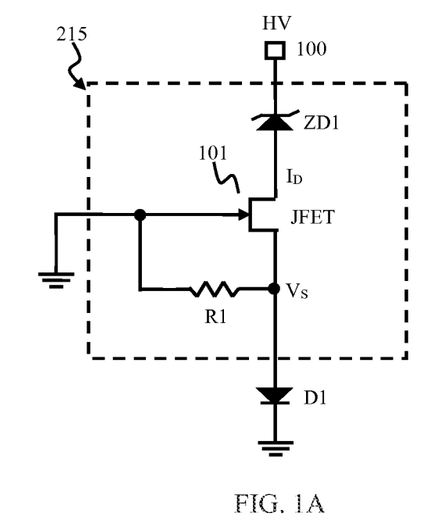
FIG. 1A is a circuit diagram showing the structure of the detection unit for detecting changes in the input voltage $V_{HV}$.

Referring to FIG. 1A, a basic detection unit 215 mainly comprises a junction field effect transistor (JFET) 101 and a Zener diode ZD1, where the anode of the Zener diode ZD1 is connected to the drain of the JFET 101, while the source of JFET 101 is connected to the anode of a diode D1, and the cathode of diode D1 is connected to the ground. The control terminal of JFET 101, such as the gate, is connected to the ground, and a resistor R1 is connected between the gate and the source of JFET 101. An input DC voltage $V_{HV}$ is supplied to the detection unit 215 at a node 100 connected to the cathode of the Zener diode ZD1. The input voltage $V_{HV}$ is usually obtained by full-wave rectification of the AC power supply, where both the positive and negative half cycle of a complete sine wave AC input voltage are converted into a DC voltage $V_{HV}$.

In a first condition, when the input voltage $V_{HV}$ is greater than the breakdown voltage $V_Z$ of Zener diode ZD1, reversible or resuming Zener breakdown occurs in the Zener diode ZD1, resulting in the current $I_D$ flowing from the drain to the source of JFET 101. Current $I_D$ flows through the resistor R1 and the diode D1, thus the forward voltage drop $V_{SG}$ across resistor R1 increases, simultaneously causing the voltage $V_{GS}$ between the source and gate of JFET 101 decreasing. The voltage $V_{GS}$ between the source and gate of JFET 101 will stabilize at a pinch-off voltage of JFET with a voltage value $V_P$, where $V_{GS}$ is equal to the negative value of the absolute value of pinch-off voltage $V_P$ ($|V_P|$). Conversely, the voltage $V_{SG}$ across the resistor R1 will be equal to a positive value of the absolute value of pinch-off voltage $V_P$. In a second condition, when the input voltage $V_{HV}$ is lower than the breakdown voltage $V_Z$ of the Zener diode ZD1, breakdown of the Zener diode ZD1 does not occur, hence there is not a current flowing through JFET 101, i.e., the voltage $V_{SG}$ across the resistors R1 will be zero, as such there is no power consumption in the detection unit 215. Since there is a voltage across the resistor R1 in the first condition, and in the second condition there is no power consumption in the detection unit 215, when the change of the input voltage $V_{HV}$ is monitored, the overall power consumption of the detection circuit is limited to a smaller range.

Figure 1B:
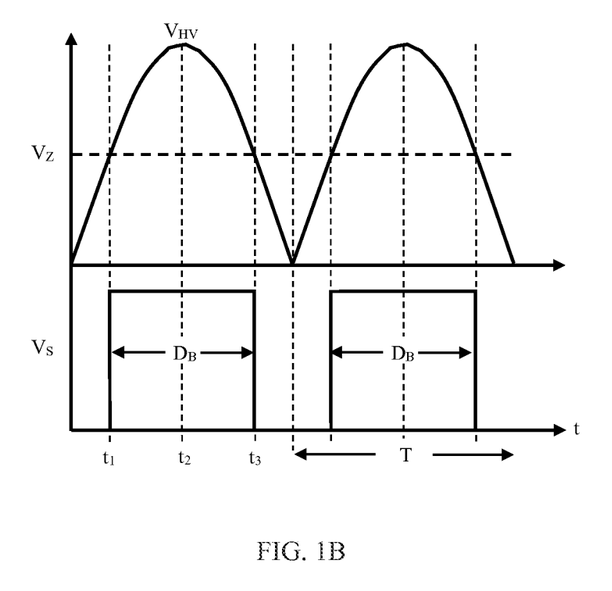
FIG. 1B is the output waveform of the detection unit when the input voltage $V_{HV}$ exceeds the breakdown voltage of the Zener diode.

Referring to FIG. 1B, the breakdown of the Zener diode ZD1 occurs, or detection unit 215 enters the first condition when the input voltage $V_{HV}$ is greater than the breakdown voltage $V_Z$, in a time period $t_1$ to $t_3$. For example in a time period T, at time $t_1$, the input voltage $V_{HV}$ rises above the breakdown voltage $V_Z$, and the input voltage $V_{HV}$ is maintained greater than the breakdown voltage $V_Z$ until time $t_3$ at that time the input voltage $V_{HV}$ drops to lower than the breakdown voltage $V_Z$. Under the first condition, there is a non-zero voltage $V_S$ at the source terminal of JFET 101, indicating that the source terminal output from JFET 101 is logical high level, thus the output voltage $V_S$ of the detection unit 215 is at the first state. Referring to FIG. 1B, the breakdown of Zener diode ZD1 does not occur, or the detection unit 215 is in the second condition where the input voltage $V_{HV}$ is less than the breakdown voltage $V_Z$, before time $t_1$ and after time $t_3$ of the cycle T. Under the second condition, there is a zero voltage $V_S$ at the source terminal of JFET 101 indicating that the source terminal of JFET 101 is logical low level, thus the output voltage $V_S$ of the detection unit 215 is at the second state.

The device and method of the present invention is to detect the changes in voltage produced at the source terminal of JFET 101 as the dynamic detection voltage $V_S$ produced by the detection unit 215 in responses to changes in the input voltage $V_{HV}$. FIG. 1B also uses the duty cycle method to show the level and logical state of the detection voltage $V_S$, in order to visually reflect the first condition when the breakdown of the Zener diode ZD1 occurs and the second condition when the breakdown of the Zener diode ZD1 does not occur. Setting the peak of the input voltage $V_{HV}$ occurs at time t2, duration between time $t_1$ to time $t_3$ is 2 ($t_2-t_1$), the total duration of the detection voltage $V_S$ in the first state within a period T is 2 ($t_2-t_1$), as such the B-duty cycle $D_B$ of the detection voltage $V_S$ in the first state can also be interpreted as the time ratio when the breakdown of the Zener diode ZD1 occurs.

Figure 2:
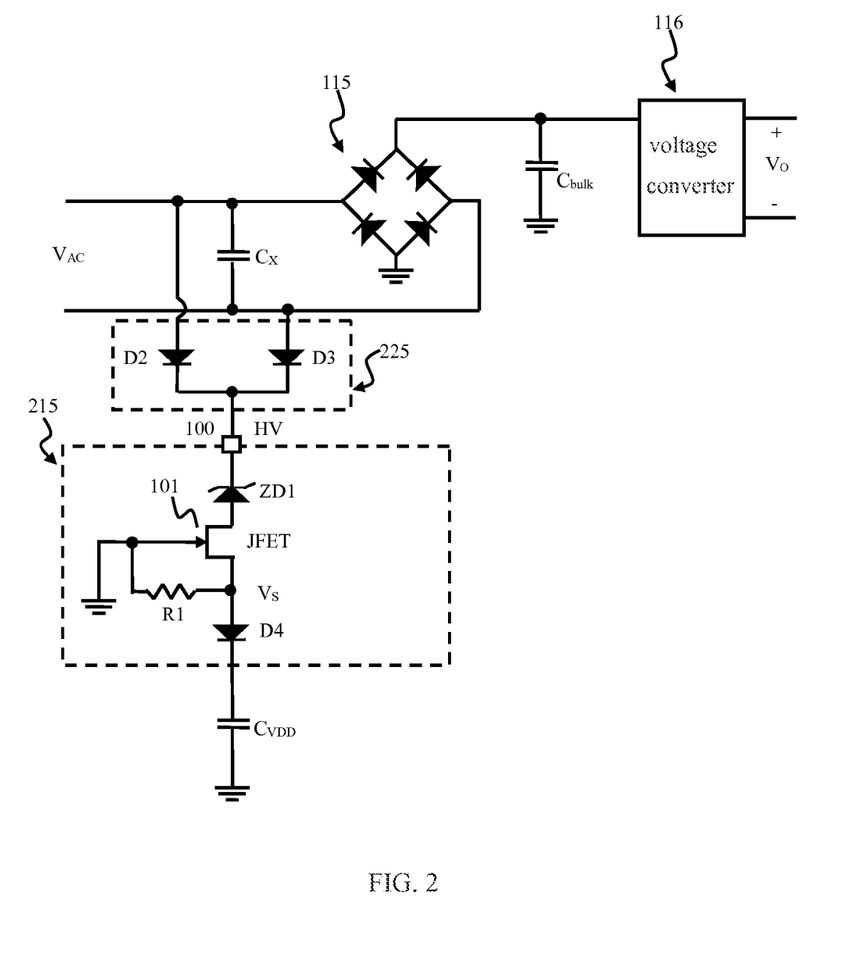
FIG. 2 is a circuit diagram showing the AC voltage $V_{AC}$ is rectified generating a DC input voltage $V_{HV}$ which is transmitted to the detection unit.

Referring to FIG. 2, the AC voltage $V_{AC}$ supplied from the grid power, after the high frequency noise signal is filtered out by the high-frequency filter capacitor $C_X$, is transmitted to a bridge rectifier 115, and after a full-wave rectification through the bridge rectifier 115, generating an DC voltage stored in an output capacitor $C_{bulk}$ then after further modulation by the voltage converter 116, e.g., boost or buck modulation, finally producing a DC output voltage $V_O$ with small ripple, which is the conventional techniques employed in the conventional AC-DC conversion system. In the present invention, two rectifier diodes D2 and D3 are connected respectively to the two input terminal of the AC voltage $V_{AC}$ forming a rectifier circuit 225, where the anode of the diode D2 is connected to one end of the high frequency filter capacitor $C_X$ and the anode of the other diode D3 is connected to the other end of the high frequency filter capacitor $C_X$. The cathodes of both rectifier diodes D2 and D3 are connected to the cathode of the Zener diode ZD1 at node 100. Thus the supplied AC voltage $V_{AC}$ is applied to the AC-DC conversion system and also to the rectifier circuit 225 at the same time. The AC voltage $V_{AC}$ is rectified through the rectifier circuit 225 producing a DC input voltage $V_{HV}$ at the cathodes of both diode D2 and D3, which is then sent to the detection unit 215 at node 100. The rectified DC pulsation waveform of the input voltage $V_{HV}$ is illustrated in FIG. 1B.

As shown in FIG. 2, the source terminal JFET 101 of the detection unit 215 is connected to the anode of a diode D4, and a power supply capacitor $C_{VDD}$ is connected between the cathode of the diode D4 and the ground. When the breakdown of the Zener diode ZD1 occurs, the current flowing through the JFET 101 charges the power supply capacitor $C_{VDD}$ storing the energy that then becomes the DC power supplied to the AC-DC converter. When the breakdown of the Zener diode ZD1 does not occur, the power supply capacitor $C_{VDD}$ is not charged. The operating mechanism of the detection unit 215 of FIG. 2 is the same as the detection unit 215 in FIG. 1A. The diode D4 is used to avoid power reversal, thus preventing the voltage source provided by the power supply capacitors $C_{VDD}$ clamping the voltage $V_S$ at the source terminal of the JFET 101 at a high potential.

Figure 3:
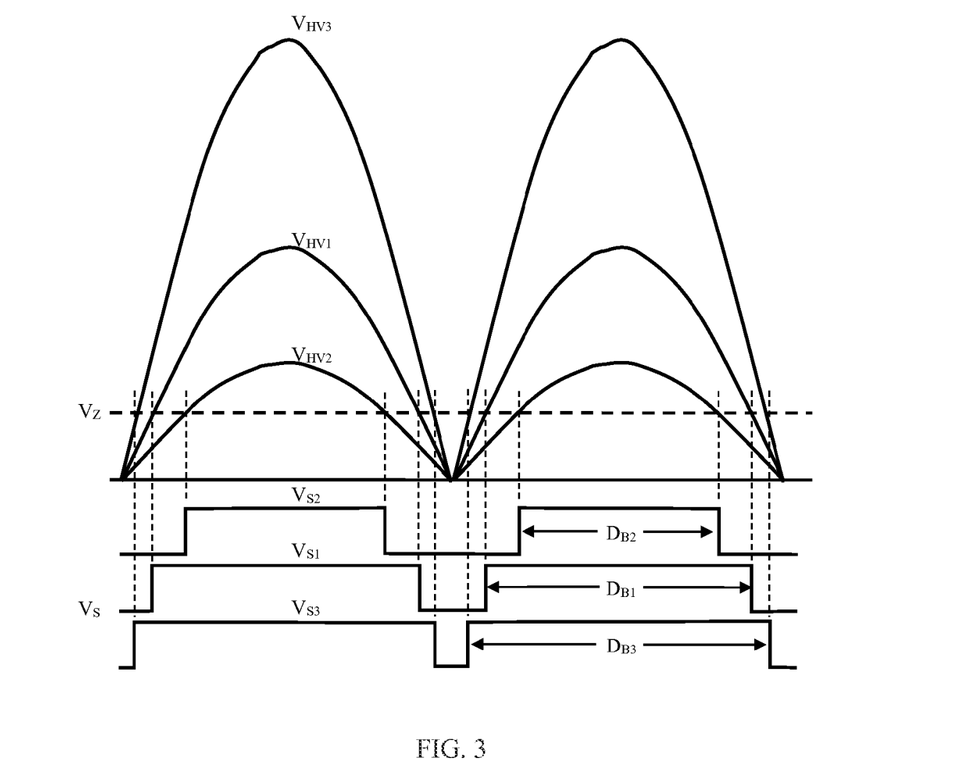
FIG. 3 waveforms showing the different duty cycles of the detection signal produced by different level input voltages $V_{HV}$.

FIG. 3 shows the changes in the actual duty ratio $D_B$ corresponding to the changes in amplitude of the input voltage $V_{HV}$. As a comparison, a number of input voltages $V_{HV1}$, $V_{HV2}$ and $V_{HV3}$ having different amplitudes or peaks are inputted to the cathode end of the Zener diode ZD1 of the detection unit 215 sequentially, in which input voltage $V_{HV3}$ has the largest peak, input voltage $V_{HV2}$ has the smallest peak, and the peak of input voltage $V_{HV1}$ is in-between $V_{HV2}$ and $V_{HV3}$ ($V_{HV2}<V_{HV1}<V_{HV3}$), but their period T is the same. When the input voltage is $V_{HV1}$, the duty cycle of the detection voltage signal $V_{S1}$ generated by the detection unit 215 is $D_{B1}$, when the input voltage is $V_{HV2}$, the duty cycle of the detection voltage signal $V_{S2}$ generated by the detection unit 215 is $D_{B2}$, when the input voltage is $V_{HV3}$, the duty cycle of the detection voltage signal $V_{S3}$ generated by the detection unit 215 is $D_{B3}$. When three input voltages of different amplitudes are applied, the result is that the duty cycle $D_{B3}$ is the largest, duty cycle $D_{B1}$ is smaller than $D_{B3}$ but larger than $D_{B2}$ ($D_{B2}<D_{B1}<D_{B3}$).

Referring to FIG. 1B, the duty ratio $D_B$ satisfy the following relation:

$$D_B = \frac{t_2 - t_1}{t_2} = 1 - \frac{t_1}{t_2} \tag{1}$$

Since the input voltage $V_{HV}$ captures the rectified results of the positive half cycle and the negative half-cycle of the AC input voltage $V_{AC}$, when the instantaneous value of input voltage $V_{HV}$ at time $t_1$ is $V_{HV}(t_1)$, the effective input voltage is $V_{HVR}$, and Zener diode ZD1 breakdown voltage is $V_{Z1}$, all of which satisfy the following relationship:

$$V_{HV}(t_1) = \sqrt{2} V_{HVR} \cdot \sin(\omega t_1) = V_{Z1} \tag{2}$$

In addition, if the instantaneous value of an input voltage $V_{HV}$ at time $t_2$ is $V_{HV}(t_2)$ and the effective input voltage is $V_{HVR}$, which also satisfy the following relationship:

$$V_{HV}(t_2) = \sqrt{2} V_{HVR} \cdot \sin(\omega t_2) = \sqrt{2} V_{HVR} \tag{3}$$

From the phase relationship between sine values, it is known that $\omega t_1$ and $\omega t_2$ satisfy the following relationship:

$$\omega t_1 = \sin^{-1}\left(\frac{V_{Z1}}{\sqrt{2} V_{HVR}}\right) \tag{4}$$

$$\omega t_2 = 90° \tag{5}$$

Divide the result of Equation (4) by (5) and substituting the result into equation (1), to obtain:

$$\frac{t_1}{t_2} = \frac{\sin^{-1}\left(\frac{V_{Z1}}{\sqrt{2} V_{HVR}}\right)}{90°} = 1 - D_B \tag{6}$$

Rewriting Equation (6) and obtain:

$$\frac{V_{Z1}}{V_{HVR}} = \sqrt{2} \sin[90°(1 - D_B)] \tag{7}$$

In reality, the AC power sources of different regions are different, thus the so-called RMS or also known as the effective voltage $V_{HVR}$ would be different. For example, a $V_{HVR}$ of 100V and a breakdown voltage $V_{Z1}$ of the Zener diode ZD1 of 50V are substituted into the formula (7):

$$\frac{50\,V}{100\,V} = \sqrt{2}\sin[90°(1-D_B)] \qquad (8)$$

Therefore, $1-D_B=0.23$, or $D_B=0.77$.

In general the effective value of the AC power source in certain regions are usually fixed, but the breakdown voltage $V_{Z1}$ can be adjusted, for example the direct selection of a Zener diode ZD1 of a particular model with a breakdown voltage $V_{Z1}$ of a particular value, or by connecting a plurality of Zener diodes ZD1 in series, varying the number of Zener diodes ZD1 to increase the $V_{Z1}$ value.

Figure 4A:
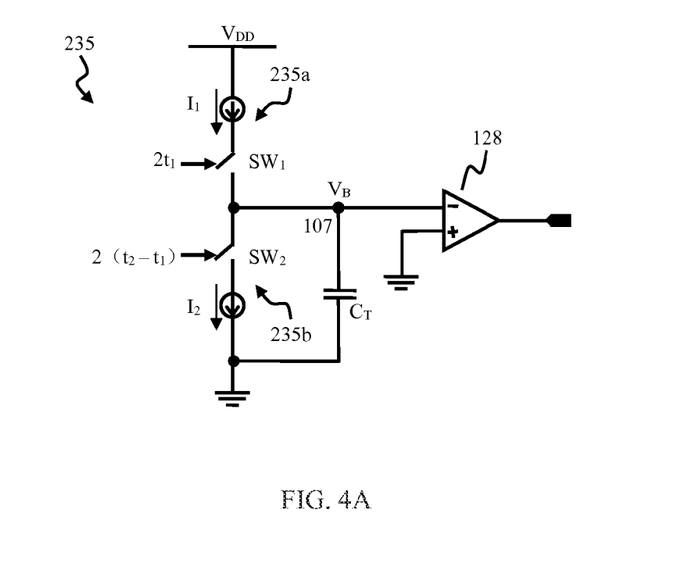
FIG. 4A shows a charge-discharge circuit with a capacitor $C_T$.

Referring to FIG. 4A of a charge-discharge circuit 235, a charge current source unit 235a, turned on or off by a switch $SW_1$, is designed to charge a charge-discharge capacitor $C_T$, and a discharge current source unit 235b, turned on or off by a switch $SW_2$, is designed to discharge the charge-discharge capacitor $C_T$. The charge-discharge capacitor $C_T$ is connected between node 107 and the ground, where the charging step and discharging step of the capacitor $C_T$ are executed alternately using the drive signal transmitted by the detection unit 215 to control the switches $SW_1$ and $SW_2$. A charge current provided by the charge current source unit 235a is $I_1$, the charge time is $T_c$, and a discharge current provided by the discharge current source unit 235b is $I_2$, the discharge time is $T_d$, as such the charge-discharge capacitor satisfies the charge-discharge formula $I_1 \times T_c = I_2 \times T_d$.

With the start-up of charge-discharge circuit 235, which is a triangle signal generating circuit, the switches $SW_1$ and $SW_2$ will be alternately turned on, i.e., when one is turned on the other one must be turned off, prompting the capacitor $C_T$ to charge and then discharge, thus producing an expected triangle voltage signal $V_B$ at node 107 at the ungrounded end of the charge-discharge capacitor $C_T$. The voltage of the capacitor $C_T$ at node 107 may be reduced to zero, hence, the node 107 is connected to the inverting input of a primary comparator 128, and the non inverting input of the primary comparator 128 is connected to a near zero critical potential, for example the non inverting input terminal directly connects to the ground. When the potential of the node 107 is reduced to zero, the output terminal of the primary comparator 128 will transmit a detection signal having a logical high level.

Figure 4B:
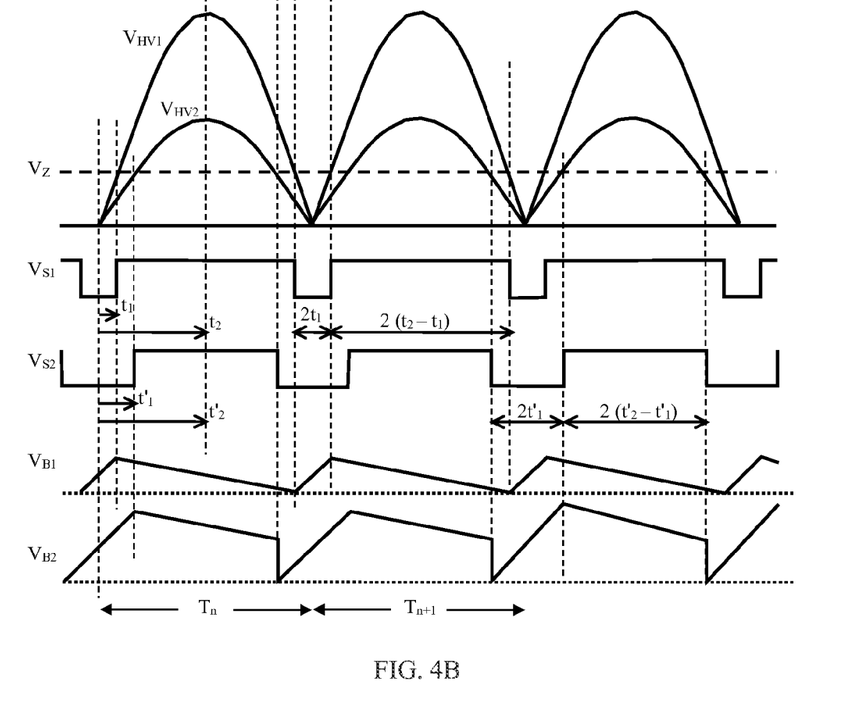
FIGS. 4B-4C shows the charge and discharge timing of the capacitor $C_T$ corresponding to a logical high or low state of the detection voltage signal under different duty cycles.

Referring to FIG. 4B, in accordance to the charge-discharge model of the charge-discharge circuit 235 of FIG. 4A, when the input voltage $V_{HV1}$ is applied the detection unit 215 generates the logic level waveform of detection voltage signal $V_{S1}$ and when the input voltage $V_{HV2}$ is applied the detection unit 215 generates the logic level waveform of detection voltage signal $V_{S2}$, with the peak of input voltage $V_{HV1}$ being larger than the that of input voltage $V_{HV2}$. In the same period T, the duty cycle of detection voltage signal $V_{S1}$ is greater than the duty cycle of detection voltage signal $V_{S2}$. After the charge-discharge circuit 235 starts up and is in stable operation, the input voltage $V_{HV1}$ within two adjacent cycles $T_n$ and $T_{n+1}$ is used as an example to illustrate a charge-discharge cycle. In cycle $T_n$, at the falling edge when the detection voltage signal $V_{S1}$ changes from a high level to a low level, charging process of capacitor $C_T$ begins and continues until the rising edge in cycle $T_{n+1}$ when the detection voltage signal $V_{S1}$ changes from a low level to a high level, charging process of capacitor $C_T$ ends and the capacitor $C_T$ immediately begins to discharge, and continues discharging until the falling edge when the detection voltage signal $V_{S1}$ changes from a high level to a low level, thus completing a full charge-discharge cycle.

For a complete charge-discharge cycle, the charging starting point in a cycle is at the falling edge when the detection voltage signal $V_S$ changes from the high level to the low level, and the charging cut-off point, also the discharging starting point, is at the rising edge when the detection voltage signal $V_S$ changes from a low level to a high level of the consecutive cycle then the discharging cut-off point is at the falling edge of the same consecutive cycle when the detection voltage signal $V_S$ changes from a high level to a low level. Using input voltage $V_{HV1}$ having a reference effective value $V'_{HVR}$ with a corresponding reference peak for example, setting each charging duration of capacitor $C_T$ to $2t_1$, where the detection voltage signal $V_{S1}$ is in the second state of a logical low level; and setting each discharging duration of capacitor $C_T$ to $2(t_2-t_1)$, where the detection voltage signal $V_{S1}$ is in the first state of a logical high level. When the preset charging time and discharging time are satisfied, the amount of charge during charging duration $2t_1$ is exactly equal to the amount of charge during discharging duration $2(t_2-t_1)$, then in the consecutive cycle at the falling edge when the voltage detection signal $V_{S1}$ changes from the high level to the low level, all charges in capacitor $C_T$ is completely discharged. When the input voltage is $V_{HV1}$, the changes in charge-discharge voltage of capacitor $C_T$ is reflected by the triangular voltage signal $V_{B1}$ in FIG. 4B, and the duty cycle for the detection voltage signal $V_{S1}$ is $D_{B1}$.

Setting duration $2t_1$ as the reference charging time, duration $2(t_2-t_1)$ as a reference discharging time and the duty ratio $D_{B1}$ as the reference duty cycle; combining $D_B$ calculated in Equation (6) and the charge-discharge current of capacitor $C_T$ will satisfy the following formulas:

$$I_1 \times t_1 = I_2 \times (t_2 - t_1) \qquad (9)$$

$$\frac{I_1}{I_2} = \frac{t_2 - t_1}{t_1} = \frac{t_2}{t1} - 1 = \frac{D_B}{1 - D_B} \qquad (10)$$

where $I_1$ is the current provided by the charge current source unit 235a and $I_2$ is the current provided by the discharge current source unit 235b.

In an example, if $D_B=0.77$, the ratio $I_1/I_2$ equals 0.77/0.23. As mentioned above, if the input voltage has an effective reference value $V'_{HVR}$, and at the same time the duty cycle $D_B$ obtained satisfy both equation (7) and Equation (10), the amount of charges received by the capacitor $C_T$ during the charging duration $2t_1$ will be completely discharged at the moment when duration $2(t_2-t_1)$ ends, thus the duty cycle obtained at this time is regarded as the reference duty $D_{B1}$.

Figure 4C:
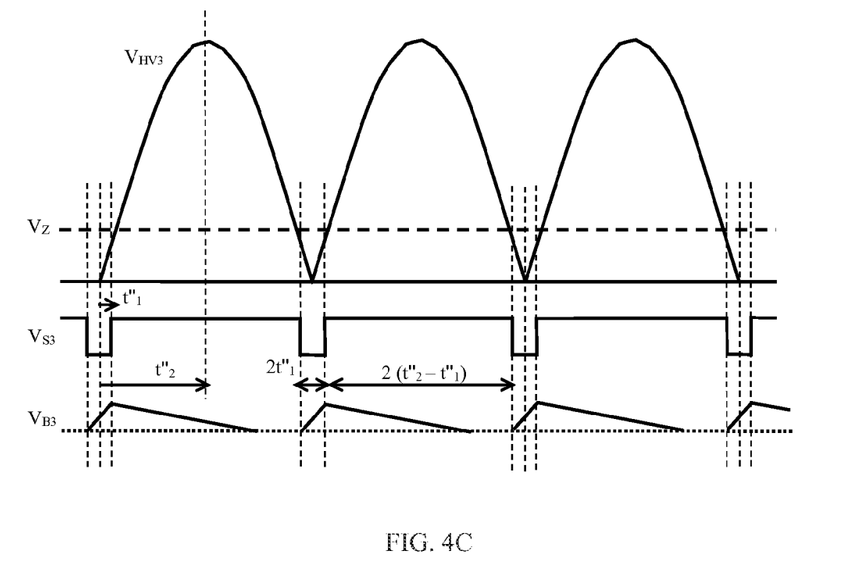

In an embodiment of FIG. 4C, the input voltage $V_{HV3}$ has a peak higher than the input voltage $V_{HV1}$, where the charging duration $2t''_1$ is less than $2t_1$ but the discharging duration $2(t''_2-t''_1)$ is greater than $2(t_2-t_1)$, the actual duty cycle $D_{B3}$ of voltage detection signal $V_{S3}$ will be greater than the reference $D_{B1}$, producing a waveform $V_{B3}$ as shown in FIG. 4C at node 107 at the ungrounded end of the capacitor $C_T$. Within a complete charge-discharge cycle, the total amount of charge stored in the capacitor $C_T$ within charging duration $2t''_1$ when the detection voltage signal $V_{S3}$ is at low level is small, which is not enough for the capacitor $C_T$ to have a sustained discharge throughout duration 2 ($t''_2-t''_1$) when the detection voltage signal $V_{S3}$ is at a high level. In other words, in the discharge cycle, within a time period from the discharge starting point when the detection voltage signal $V_{S3}$ changes from a low level to a high level to a time in the same period before the falling edge when the detection voltage signal $V_{S3}$ changes from the high level to the low level, the stored charge on the capacitor $C_T$ has been completely discharged, which means the actual discharge time is less than the predetermined discharge time period 2 ($t''_2-t''_1$), and the voltage signal $V_{B3}$ will be reduced to zero within duration 2 ($t''_2-t''_1$) when the detection voltage signal $V_{S3}$ is in the first state, instead of the amount of charge becoming zero when the duration 2($t''_2-t''_1$) ends. The changes of voltage due to charging and discharging of capacitor $C_T$ is reflected the triangular voltage signal $V_{B3}$ in FIG. 4C.

In FIG. 4B, the input voltage $V_{HV2}$ has a smaller peak value than the input voltage $V_{HV1}$, where the charging duration $2t'_1$ is greater than $2t_1$ but the discharging duration 2 ($t'_2-t'_1$) is less than 2 ($t_2-t_1$), and the peak of input voltage exceeds the breakdown voltage $V_{Z1}$ generating a triangular voltage signal $V_{B2}$ at node 107, the actual duty cycle $D_{B2}$ of the correspondingly detection voltage signal $V_{S2}$ will be less than the reference $D_{B1}$, which is completely opposite to FIG. 4C. Within a complete charge and discharge cycle, the amount of charge received by capacitor $C_T$ within duration $2t'_1$, when the detection voltage signal $V_{S2}$ is in low level, is very large and is not able to be discharged completely within duration 2 ($t'_2-t'_1$) when the detection voltage signal $V_{S2}$ is at a high level. In other words, during the discharge phase, i.e., from the discharge starting point within a cycle when the detection voltage signal $V_{S2}$ changes from low level to high level to the falling edge within the same cycle when the detection voltage signal $V_{S2}$ changes from high level to low level, residual charges will remain in the capacitor $C_T$. At this time the changes of voltage due to charging and discharging of capacitor $C_T$ is reflected by the triangular voltage signal $V_{B2}$ in FIG. 4B. In fact, after the falling edge when the detection voltage signal $V_{S2}$ changes from a high level to a low level, charging of capacitor $C_T$ will continue until there is excess residual charges in the capacitor $C_T$ at that falling edge, then the amount of charges in capacitor will continue to accumulate and thus the charge and discharge procedures cannot be completed. As mentioned above, a complete charge and discharge cycle ends at the discharge cut-off point which is the falling edge when the detection voltage signal $V_{S2}$ changes from the high level to the low level within the cycle, regardless of whether the capacitor $C_T$ has any residual charges stored. Hence at the discharge cut-off point, it is necessary to initiate the discharge of the residual charges in the capacitor $C_T$, causing the amount of the charge in capacitor $C_T$ to drop sharply, which will be described in detail later. As shown in FIG. 4B, at the falling edge of the detection voltage signal $V_{S2}$, the capacitor $C_T$ is discharged so that the amount of charge is close to zero, in fact the actual value is slightly greater than zero, for example, less than 0.1 volts, as such at the falling edge the waveform of the voltage signal $V_{B2}$ drops substantially vertical.

In summary, when the detection voltage signal $V_S$ has a duty cycle equals to the reference $D_{B1}$, after discharging process begins, the voltage signal $V_{B1}$ becomes zero right at the moment of falling edge of the detection voltage signal $V_S$. When the duty cycle of the detection voltage signal $V_S$ exceeds the reference $D_{B1}$, after discharging process begins, the voltage signal $V_{B1}$ becomes zero right at a certain time before the falling edge of the detection voltage signal $V_S$. When the duty cycle of the detection voltage signal $V_S$ is smaller than the reference $D_{B1}$, after discharging process begins, the voltage signal $V_{B1}$ will substantially be, at close to but slightly greater than, zero at the falling edge of the detection voltage signal $V_S$. In FIG. 4A, node 107 is connected to the inverting input of the primary comparator 128 while the non-inverting input of the primary comparator 128 is grounded. Hence when the duty cycle is $D_{B1}$, the primary comparator 128 can output a logical high level signal within each cycle of the input voltage $V_{HV}$, which occurs at the falling edge of the detection voltage signal $V_S$. When the duty cycle is greater than $D_{B1}$, the primary comparator 128 can output a logical high level signal within each cycle of the input voltage $V_{HV}$, which occurs after the rising edge and before the falling edge of the detection voltage signal $V_S$. When the duty cycle is less than $D_{B1}$, the primary comparator 128 is not able to output a logical high level signal within each cycle of the input voltage $V_{HV}$.

Figure 5:
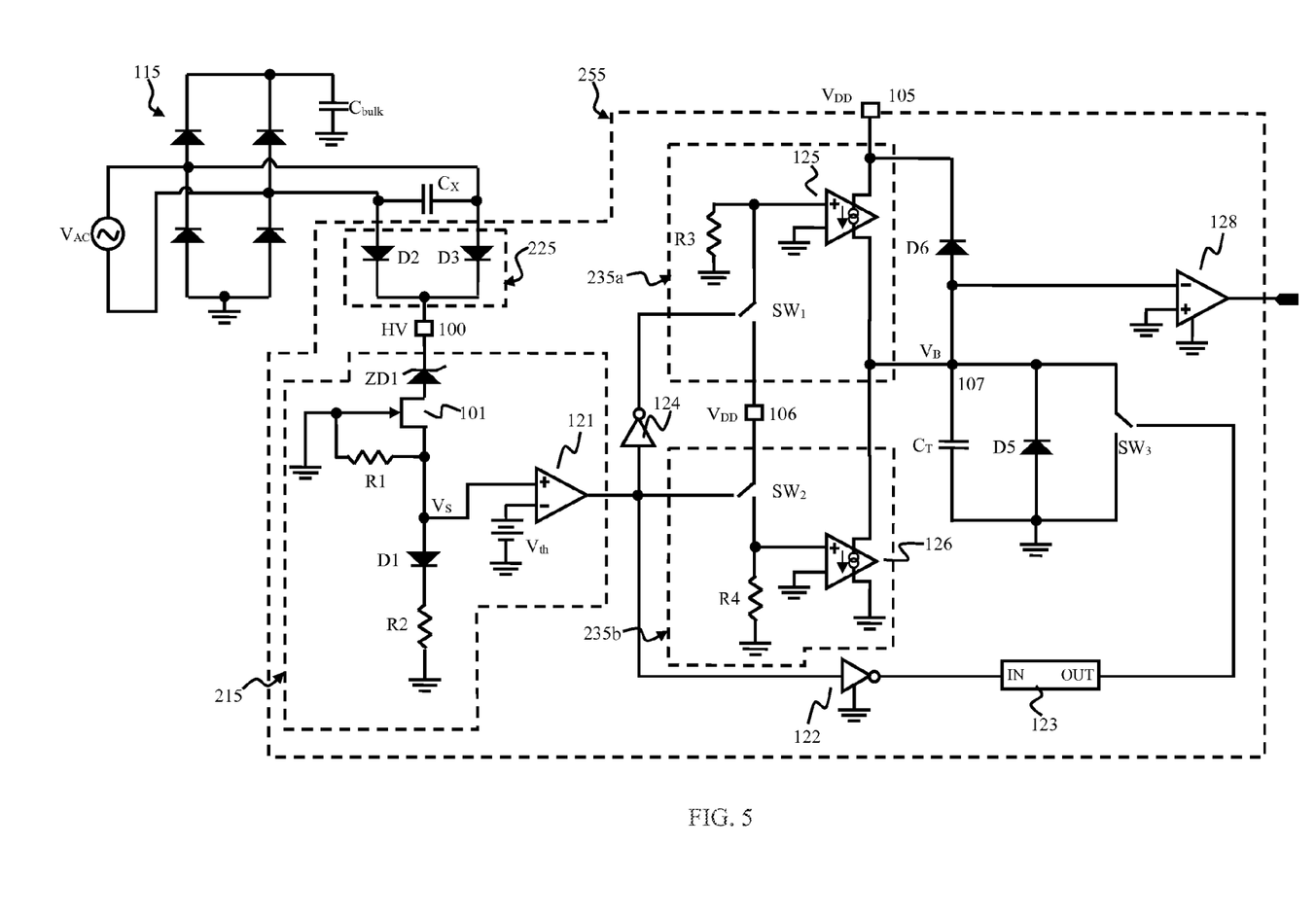
FIG. 5 is a voltage detection circuit diagram comprising the detection unit.

As shown in FIG. 5, the supplied AC input voltage $V_{AC}$, after filtered by the high-frequency filter capacitor $C_X$, is fed to a conventional bridge rectifier 115 for a full-wave rectification thus producing the desired DC voltage applied to an output capacitor $C_{bulk}$. The AC voltage $V_{AC}$ is also fed to a rectifier circuit 225 of the voltage detection circuit 255, where the anode of diode D2 in the rectifier circuit 225 is connected to an input terminal that supplies the AC voltage $V_{AC}$, the anode of another diode D3 in the rectifier circuit 225 is connected to the other input terminal that supplies the AC voltage of $V_{AC}$. The voltage detection circuit 255 has a detection unit 215, and the cathodes of the two rectifier diodes D2 and D3 are connected to the cathode of the Zener diode ZD1 in the detection unit 215, while the anode of the Zener diode ZD1 is connected to the drain of JFET 101, and the source of JFET 101 is connected to the anode of a diode D1. Furthermore, a resistor R2 is connected between the cathode of diode D1 and the ground. The control terminal of JFET 101, which is the gate, is connected to the ground, and a resistor R1 is connected between the gate and the source of JFET 101. Detection unit 215 further includes a comparator 121 used in the transmission of a drive signal to control the ON/OFF state of the switches $SW_1$, $SW_2$, and $SW_3$. A threshold voltage $V_{TH}$ greater than zero is applied to the inverting input of comparator 121, while the non-inverting input terminal of the comparator 121 is connected to the source of JFET 101.

In FIG. 5, the DC input voltage $V_{HV}$ obtained by rectifying a supplied AC input voltage $V_{AC}$ by the rectifier circuit 225 is sent to the detection unit 215 at node 100 on the cathode end of the Zener diode ZD1. As mentioned above, when the input voltage $V_{HV}$ is greater than the breakdown voltage $V_Z$ of the Zener diode ZD1, Zener breakdown occurs in the Zener diode ZD1, as such the voltage $V_S$ generated by voltage detection unit 215 is greater than a preset threshold voltage $V_{TH}$, thus the comparator 121 generates a high level signal reflecting the detection voltage signal $V_S$ in the first state with a high level. Conversely, when the input voltage $V_{HV}$ is less than the breakdown voltage $V_Z$ of Zener diode ZD1, the breakdown of the Zener diode ZD1 does not occurs, as such the output voltage $V_S$ generated by detection unit 215 is smaller than the preset threshold voltage $V_{TH}$, thus the comparator 121 generate a low level signal reflecting the detection voltage signal $V_S$ in the second state with a low level.

FIG. 5 shows in detail the charge-discharge circuit 235 of FIG. 4A. The output terminal of comparator 121 is connected to the input of an inverter 124 in the voltage detection circuit 255, the output terminal of the inverter 124 is connected to the control terminal of a switch $SW_1$ in the charge current source unit 235a, and the ON/OFF state of switch $SW_1$ controls whether the voltage-current converter 125 starts the charging process. Switch $SW_1$ and switches $SW_2$, $SW_3$ (which will be described later) are three-port electronic switches, i.e., these switches also include a control terminal that controls the turning on or off of other two input terminals. These switches can be P-type or N-type MOS transistor, a bipolar transistor, a junction transistor, or a combination thereof. The output terminal of comparator 121 is also connected to the control terminal of a switch $SW_2$ in the discharge current source unit 235b, and the ON/OFF state of switch $SW_2$ controls whether the voltage-current converter 126 starts the discharging process. The three-port switches $SW_2$ and $SW_1$ has a similar structure. In the process of the comparator 121 generating a drive signal, due to the inverter 124, the control terminal of the switch $SW_1$ causes it to turn on at a low level drive signal and turn off at a high level drive signal, while the control terminal of the switch $SW_2$ causes it to turn on at a high level drive signal and turn off at a low level drive signal. Note that both switches $SW_1$ and $SW_2$ cannot be simultaneously turned on or off, but being turned on alternately.

In the charge current source unit 235a, at node 105, a DC power supply voltage $V_{DD}$ is supplied to the voltage-current converter 125, which is also provided in another node 106, and the switch $SW_1$ and a resistor R3 are connected in series between node 106 and the ground. For the charging process, when switch $SW_1$ is turned on, resister R3 prevents the supply voltage $V_{DD}$ directly shorted to the ground, and the power supply voltage $V_{DD}$ is supplied to the voltage-current converter 125. The current output terminal of the voltage-current converter 125 is connected to node 107 at the ungrounded end of the charge-discharge capacitor $C_T$, as such the voltage-current converter 125 converts the power supply voltage $V_{DD}$ to the charge current $I_1$ to charge capacitor $C_T$. Since only under the condition that the comparator 121 outputs a low level signal, the switch $SW_1$ will be turned on, hence the charge current $I_1$ is generated to charge the capacitor $C_T$ only occurs when the input voltage $V_{HV}$ is lower than the breakdown voltage $V_Z$ of the Zener diode ZD1, which is when the detection voltage signal $V_S$ has a logical low level or second state.

In the discharge current source unit 235b, a switch $SW_2$ and a resistor R4 are connected in series between node 106 and the ground. As mentioned above, the power supply voltage $V_{DD}$ is applied at node 106. When the switch $SW_2$ is turned on, the resistor R4 prevents the supply voltage $V_{DD}$ shorted to ground directly, and the power supply voltage $V_{DD}$ is supplied to the voltage-current converter 126. The input terminal of the voltage-current converter 126 is connected to node 107 at the ungrounded end of the charge-discharge capacitor $C_T$, when switch $SW_2$ is turned on, the voltage-current converter 126 converts the power supply voltage $V_{DD}$ to a discharge current $I_2$, which discharges the capacitor $C_T$. The switch $SW_2$ will be turned on only when the comparator 121 outputs a high level, hence the discharge current $I_2$ thus causes the discharge of capacitor $C_T$ only when the input voltage $V_{HV}$ is higher than the breakdown voltage $V_Z$ of the Zener diode ZD1, which occurs when the detection voltage signal $V_S$ has a logical high level of the first state.

The voltage detection circuit 255 further includes a three-port switch $SW_3$ and an auxiliary diode D5, both of which are connected in parallel with the capacitor $C_T$ between the node 107 and the ground, where the anode of diode D5 is connected to the ground and the cathode of diode D5 is connected to node 107. Furthermore, the anode of another auxiliary diode D6 is connected to node 107 and its cathode is connected to the node 105. In the discharging process, as mentioned above, the discharging cut-off point is set at the falling edge when the detection voltage signal $V_S$ changes from the high level to the low level, regardless of whether any charge is stored in capacitor $C_T$, a discharging process of nanosecond level will be triggered at that moment. As shown in FIG. 5, in order to achieve this, the output signal of the comparator 121 need to be sent to the control terminal of the switch $SW_3$. In some embodiments the input terminal of monostable multivibrator 123 may be connected directly to the output terminal of the comparator 121, however in the preferred embodiment shown in FIG. 5, an inverter 122 is connected between the comparator 121 and the monostable multivibrator 123 in the voltage detection circuit 255, as such if the inverter 122 is enabled, the output terminal of comparator 121 is connected to the input of inverter 122 and the output terminal of the inverter 122 is directly connected to the input of a monostable multivibrator 123 (e.g., 100 ns one-shot), while the output of monostable multivibrator 123 is connected to the control terminal of the switch $SW_3$. The drive signal generated from the comparator 121 directly triggers monostable multivibrator 123 at each falling edge when the detection voltage signal $V_S$ changes from a first state to a second state, to sent a high level output signal to turn on switch $SW_3$. Alternatively, if the inverter 122 is enabled, at each falling edge when the detection voltage signal $V_S$ changes from a first state to a second state, after the output signal of the comparator 121 is inverted by the inverter 122 generating the inverted drive signal that will trigger the monostable multivibrator 123 at the rising edge of the inverted drive signal to transmit a high level output signal to the control terminal of the switch $SW_3$ to turn on switch $SW_3$. As a result, at each falling edge when the detection voltage signal $V_S$ changes from the high level to the low level, the switch $SW_3$ is triggered to turn on within the nanosecond thus the capacitor $C_T$ is discharged to the ground. The duration of monastable multivibrator 123 triggering the switch SW3 to turn on is very short, which can be considered as a transient discharge step, after each trigger signal is produced the monostable multivibrator 123 enters a temporary state for some time and then returns to the stable state. The waveform of voltage signal $V_B$ at node 107 at the falling edge of the detection voltage signal $V_S$ is as shown by voltage signal $V_{B2}$ in FIG. 4B where the waveform of voltage $V_{B2}$ drops substantially vertical.

Referring to FIG. 5, the non-inverting input of the primary comparator 128 is grounded and the inverting input terminal is connected to node 107. The voltage signal $V_B$ at node 107 has already been elaborated. As illustrated in FIG. 4B, when the input voltage $V_{HV1}$ has a reference effective value $V'_{HVR}$, the changes of the charge and discharge voltage of capacitor $C_T$ is reflected by the triangular voltage signal $V_{B1}$, the reference charging duration is $2t_1$, the reference discharge duration is $2(t_2-t_1)$, the reference duty cycle of the detection voltage signal $V_{S1}$ is $D_{B1}$, at such time the primary comparator 128 outputs a logical high level voltage within each cycle of the primary input voltage $V_{HV1}$, which occurs at the falling edge of the detection signal $V_{S1}$. With reference to FIG. 4B, when the detection voltage signal $V_{S2}$ has a duty cycle $D_{B2}$ that is less than $D_{B1}$, indicating the input voltage $V_{HV2}$ having a peak value smaller than that of the input voltage $V_{HV1}$, which means the voltage signal $V_{B2}$ will be at the state of close to zero and slightly larger than zero at each falling edge of the detection voltage signal $V_S$, hence the output of the primary comparator 128 is always low level. Referring to FIG. 4C, when the input voltage $V_{HV3}$ has a peak value higher than that of the input voltage $V_{HV1}$, the corresponding duty cycle $D_{B3}$ of detection voltage signal $V_{S3}$ will be greater than the duty cycle $D_{B1}$, will produce the waveform $V_{B3}$ at node 107 at one end of the capacitor. In a charge-discharge cycle, i.e. beginning from the discharge starting point when the detection voltage signal $V_{S3}$ changes from a low level to a high level within the cycle, before the time reaches the falling edge when the detection voltage signal $V_{S3}$ changes from a high level to a low level in the same cycle, the charge stored in the capacitor $C_T$ has been completely discharged, resulting in the voltage signal $V_{B3}$ drop to zero, hence the primary comparator 128 outputs a logic high level voltage when the charge of capacitor $C_T$ is zero within each cycle of the primary input voltage $V_{HV3}$.

Figure 6:
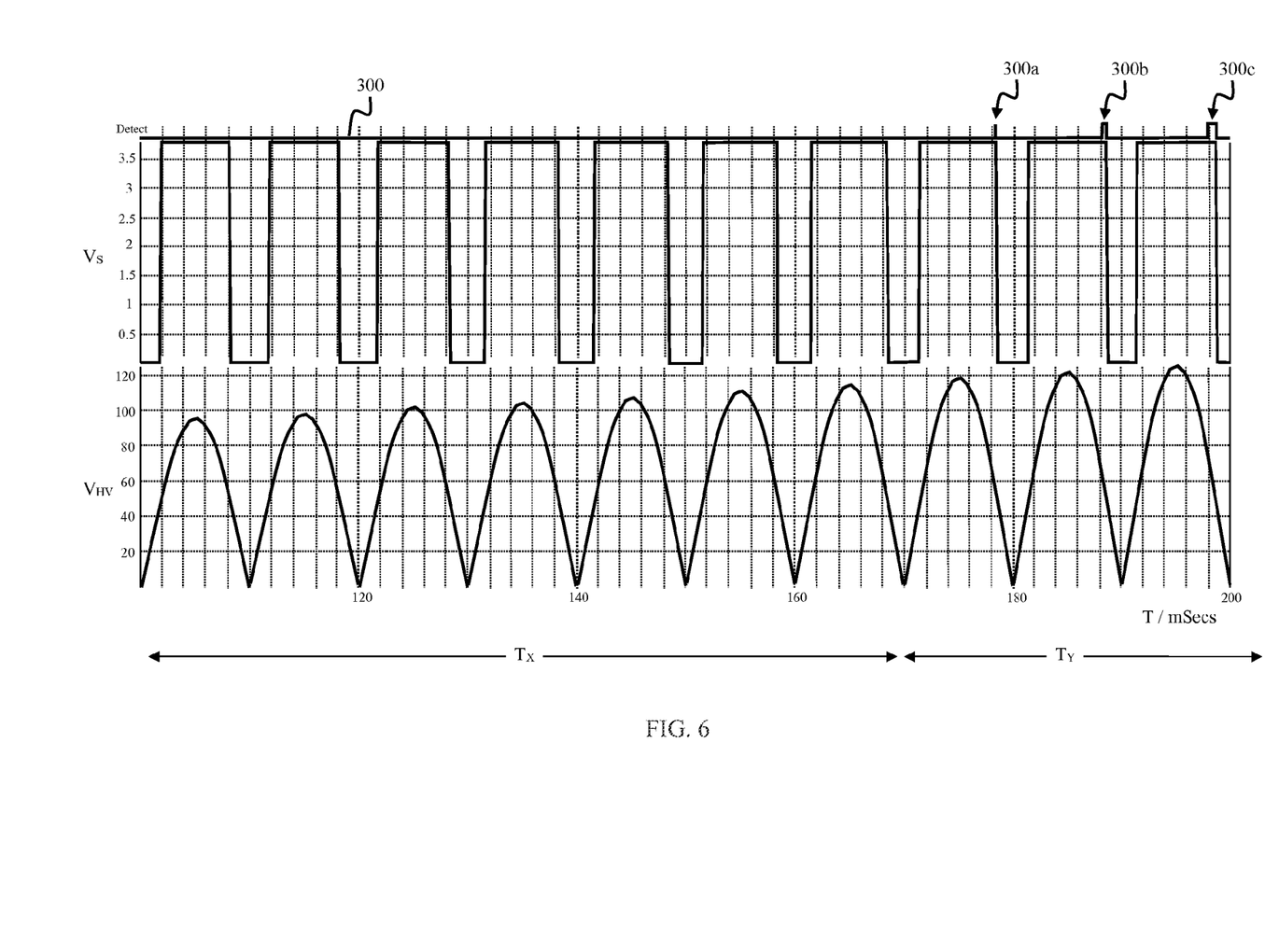
FIG. 6 shows the detection signal generated from the voltage detection circuit at different level of input voltages $V_{HV}$.

Referring to FIG. 6, from duration $T_X$ to $T_Y$, with the peak of the actual input voltage $V_{HV}$ gradually increasing with time, the change of the AC input voltage $V_{AC}$ may be determined in accordance with the method disclosed above. Within duration $T_X$, the peak of the actual input voltage $V_{HV}$ exceeds the breakdown voltage $V_Z$, but the duty cycle of the detection voltage signal $V_S$ is always lower than the reference duty cycle $D_{B1}$, hence the detection signal 300 generated by the primary comparator 128 is always of low level. In the first cycle of duration $T_Y$, the input voltage $V_{HV}$ is in the critical state of having a peak with the reference effective value $V'_{HVR}$ or equivalent, hence the primary comparator 128 outputs a logical high level 300a for the first time, which occurs at the falling edge of the detection voltage signal $V_S$ in that cycle. At every cycle after the first cycle in duration $T_Y$, the actual input voltage $V_{HV}$ has peak with value higher than that of the critical state, hence in each of these cycles the primary comparator 128 outputs a logical high level once when the charges the capacitor $C_T$ is zero, such as the high level signal 300b, 300c and so on. Assuming the reference effective value $V'_{HVR}$ equals 100V, the breakdown voltage VZ1 of the Zener diode ZD1 equals 50V, by calculation, $D_B=0.77$. For all duty cycles over 0.77, the peak or the amplitude of the input voltage $V_{HV}$ are considered to exceed $100\sqrt{2}$, as directly displayed by the high level detection signal 300 outputted from the primary comparator 128. And vice versa, for all the duty cycles less than 0.77, the peak or the amplitude of the input voltage $V_{HV}$ are considered to be less than $100\sqrt{2}$, as directly displayed by the low level detection signal 300 outputted from the primary comparator 128. On this basis the changing trend of the input voltage $V_{HV}$ is determined, which is equivalent to determining the trend of the AC input voltage $V_{AC}$ since the former is obtained by full-wave rectification of the latter.

In addition, the output terminal of the comparator 121 is connected to the input of a counter (not shown). When the counter receives the comparison result from the comparator 121 is logical low level and the state of low level is maintained more than a preset duration $T_{BO}$, and does not receive the high level comparison result from the comparator 121 within the preset de-bounce time $T_{BO}$, it determines that the input voltage $V_{HV}$ or the AC voltage $V_{AC}$ is in brown-out conditions, for example when the preset time $T_{BO}$ extended to more than one cycle time T or multiple cycles n×T, corresponding to the peak of the actual input voltage $V_{HV}$ not exceeding the Zener breakdown voltage $V_Z$ of Zener diode ZD1, which in turn trigger the counter to output a protective signal to cut off the AC-DC power conversion devices.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

The invention claimed is:

1. A voltage detection circuit comprising:
   a rectifier circuit converting an AC voltage to a DC input voltage;
   a detection unit receiving the DC input voltage and generating a detection voltage signal of different states of logic level corresponding to fluctuations of the DC input voltage amplitude;
   a capacitor;
   a charge current source unit for charging the capacitor when the detection voltage signal is in a second state of logic level;
   a discharge current source unit for discharging the capacitor when the detection voltage signal is in a first state of logic level; and
   a primary comparator comparing a varying voltage of the capacitor in the alternating processes of charging and discharging with a critical zero potential and generating a detection signal that identifies a changing trend of the input voltage.

2. The voltage detection circuit of claim 1, wherein, when the input voltage exceeds a preset value, the detection unit generates the detection voltage signal of the first state; and when the input voltage is less than the preset value, the detection unit generates a detection voltage signal of the second state.

3. The voltage detection circuit of claim 2, wherein the detection unit comprises a Zener diode and a junction field effect transistor with an anode of the Zener diode connected to a drain of the junction field effect transistor, wherein the input voltage is applied to a cathode of the Zener diode and the preset value is a breakdown voltage of the Zener diode, wherein the detection voltage signal is generated at a source of the junction field effect transistor.

4. The voltage detection circuit of claim 3, wherein the source of the junction field effect transistor is connected to a non-inverting input terminal of a comparator in the detection unit, an inverting input terminal of the comparator is applied with a threshold voltage;
   wherein when the input voltage is higher than the preset value, the detection voltage signal potential is greater than the threshold voltage, characterizing in that the detection voltage signal of the first state having a logic high level, and a drive signal generated by the comparator in the detection unit is high level;
   when the input voltage is lower than the preset value, the detection voltage signal potential is smaller than the threshold voltage, characterizing in that the detection voltage signal of the second state having a logic low level, and the drive signal generated by the comparator in the detection unit is low level.

5. The voltage detection circuit of claim 1, wherein the charge current source unit includes a voltage-current converter and a switch connected between a voltage source and an input terminal of the voltage-current converter;
wherein when the detection voltage signal is in the second state, the detection unit transmits a drive signal to turn on the switch, providing the voltage source for the charge current source unit to convert into a charge current to charge the capacitor.

6. The voltage detection circuit of claim 1, wherein the discharge current source unit comprises a voltage-current converter and a switch connected between a voltage source and an input terminal of the voltage-current converter;
wherein when the detection voltage signal is in the first state, the detection unit transmits a drive signal to turn on the switch, providing a voltage source for the discharge current source unit to convert into a discharge current to discharge the capacitor.

7. The voltage detection circuit of claim 3, wherein at a falling edge the detection voltage signal changes from the first state to the second state, the capacitor begins to charge, and at a rising edge the detection voltage signal changes from the second state to the first state, the capacitor begins to discharge; and
at each falling edge the detection voltage signal changes from the first state to the second state, a transient discharge of the capacitor occurs before the capacitor begins to charge.

8. The voltage detecting circuit of claim 7 further comprising a switch connected in parallel with the capacitor and with one end grounded, wherein a drive signal from the detection unit after going through an inverter is fed to an input terminal of a monostable multivibrator, an output terminal of the monostable multivibrator is connected to a control terminal of the switch;
a rising edge obtained by inverting the falling edge of the detection voltage signal via the inverter is used to trigger the monostable multivibrator to output a drive signal to turned on the switch thus resulting in the transient discharge of the capacitor.

9. The voltage detection circuit of claim 8, wherein a reference input voltage having a reference effective value $V_{HVR}$ is inputted to the detection unit, with the breakdown voltage of the Zener diode of $V_{Z1}$, within a cycle of the reference input voltage, a reference duty $D_B$ of the detection voltage signal having a first state is:

$$D_B = 1 - \frac{\sin^{-1}\left(\frac{V_{Z1}}{\sqrt{2}\,V_{HVR}}\right)}{90°};$$

While the charge current of the capacitor, $I_1$, and the discharge current of the capacitor, $I_2$, satisfy the relationship $$\frac{I_1}{I_2} = \frac{D_B}{1 - D_B}.$$

10. The voltage detection circuit of claim 9, wherein when an actual duty cycle is greater than the reference duty cycle $D_B$, the detection signal generated from the primary comparator in each cycle of the actual input voltage provides a high level signal, indicating a peak of the actual input voltage being greater than a peak of the reference input; or when the actual duty cycle is less than the reference duty ratio $D_B$, the detection signal generated from the primary comparator in each cycle of the actual input voltage does not provide a high level signal, indicating the peak of the actual input voltage is smaller than the peak of the reference input voltage.

11. The voltage detection circuit of claim 4, wherein an output terminal of the comparator in the detection unit is connected to an input terminal of a counter, when the counter receives an output of comparison result from the comparator of the detection unit of low level state for a period longer than a preset time, the input voltage is determined in brown-out condition.

12. A method for voltage change detection comprising the steps of:
rectifying an AC input voltage to a DC input voltage using a rectifier circuit;
inputting the DC input voltage to a detection unit generating a detection voltage signal of different states of logic level corresponding to fluctuations of the input voltage;
repeating charge and discharge processes of a capacitor, wherein
in a charge process of the capacitor, when the detection voltage signal generated by the detection unit is in a second state of logic level, a charge current source unit is used to charge the capacitor;
in the discharge process of the capacitor, when the detection voltage signal generated by the detection unit is in a first state of logic level, a discharge current source unit is used to discharge the capacitor; and
comparing a varying voltage of the capacitor in the alternating charge and discharge processes with a critical zero potential using a primary comparator, wherein a detection signal of comparison result generated by the primary comparator indicates a changing trend of the input voltage.

13. The method of claim 12, wherein when the input voltage exceeds a preset value the detection unit generates a detection voltage signal of the first state; and
when the input voltage drops below a preset value, the detection unit generates a detection voltage signal of the second state.

14. The method of claim 13, wherein in the detection unit, an anode of a Zener diode is connected to a drain of a junction field effect transistor and the input voltage is applied at a cathode of the Zener diode, when the preset value equals to a breakdown voltage of the Zener diode, the detection voltage signal is generated at a source of the junction field effect transistor.

15. The method of claim 14, wherein the source of the junction field effect transistor is connected to a non inverting input of a comparator in the detection unit, while an inverting input of the comparator is applied with a threshold voltage;
wherein when the input voltage is higher than the preset value, the detection voltage signal is greater than the threshold voltage, characterizing in that the detection voltage signal is of the first state having a logic high level, and a drive signal generated from the comparator in the detection unit is high level;
when the input voltage is below the preset value, the detection voltage signal is lower than the threshold voltage, characterizing in that the detection voltage signal is of the second state having a logic low level, and the drive signal generated from the comparator in the detecting unit is low level.

16. The method of claim 12, wherein the charge current source unit includes a voltage-current converter and a switch connected between a voltage source and a non-inverting input terminal of the voltage-current converter;

wherein when the detection voltage signal is in the second state, the detection unit transmits a drive signal to turn on the switch, providing the voltage source to the charge current source unit for converting into the charge current to charge the capacitor.

17. The method of claim 12, wherein the discharge current source unit comprises a voltage-current converter and a switch connected between a voltage source and the non-inverting input terminal of the voltage-current converter;

wherein when the detection voltage signal is in the first state, the detection unit transmits a drive signal to turn on the switch, providing a voltage source to the discharge current source unit for converting into the discharge current to discharge the capacitor.

18. The method of claim 14, wherein, at a falling edge when the detection voltage signal changes from the first state to the second state, the capacitor begins to charge, and at a rising edge when the voltage detection signal changes from the second state to the first state, the capacitor begins to discharge; and at each falling edge the detection voltage signal changes from the first state to the second state, a transient discharge of the capacitor occurs before the capacitor begins to charge.

19. The method of claim 18 further connecting a switch in parallel with the capacitor with one end grounded, wherein a drive signal generated by the detection unit and after inverted via an inverter is fed to an input terminal of a monostable multivibrator, an output terminal of the monostable multivibrator is connected to a control terminal of the switch; and inverting the falling edge of the detection voltage signal via an inverter generating a rising edge to trigger the monostable multivibrator to transmit an output signal to turn on the switch and begin the transient discharge of the capacitor.

20. The method of claim 19, wherein, a reference input voltage having an effective reference value $V_{HVR}$ is inputted to the detection unit, with the breakdown voltage of the Zener diode of $V_{Z1}$, within a cycle of the reference input voltage, a reference duty cycle $D_B$ of the detection voltage signal having a first state is as follows:

$$D_B = 1 - \frac{\sin^{-1}\left(\frac{V_{Z1}}{\sqrt{2}\,V_{HVR}}\right)}{90°};$$

while the charge current of the capacitor $I_1$ and the discharge current of the capacitor $I_2$ satisfy the relationship:

$$\frac{I_1}{I_2} = \frac{D_B}{1 - D_B}.$$

21. The method of claim 20, wherein when an actual duty cycle is larger than the reference duty ratio $D_B$, the detection signal generated from the primary comparator is high level in each cycle of the actual input voltage, indicating a peak of the actual input voltage is larger than a peak of the reference input voltage; or when the actual duty cycle is less than the reference duty cycle $D_B$, the detection signal generated from the primary comparator is not high level in each cycle of the actual input voltage, indicating the peak of the actual input voltage is smaller than the peak of the reference input voltage.

* * * * *